United States Patent
Lee et al.

(10) Patent No.: US 9,184,111 B2
(45) Date of Patent: Nov. 10, 2015

(54) WAFER-LEVEL CHIP SCALE PACKAGE

(71) Applicant: DELTA ELECTRONICS, INC., Taoyuan Hsien (TW)

(72) Inventors: Chia-Yen Lee, Taoyuan Hsien (TW); Chi-Cheng Lin, Taoyuan Hsien (TW); Hsin-Chang Tsai, Taoyuan Hsien (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 14/290,719

(22) Filed: May 29, 2014

(65) Prior Publication Data

US 2015/0129892 A1 May 14, 2015

Related U.S. Application Data

(60) Provisional application No. 61/902,201, filed on Nov. 9, 2013.

(51) Int. Cl.
*H01L 23/48* (2006.01)
*H01L 29/20* (2006.01)

(52) U.S. Cl.
CPC .......... *H01L 23/481* (2013.01); *H01L 29/2003* (2013.01); *H01L 2224/48091* (2013.01); *H01L 2224/48247* (2013.01)

(58) Field of Classification Search
CPC ............. H01L 23/52–23/5389; H01L 29/2003
See application file for complete search history.

(56) References Cited

U.S. PATENT DOCUMENTS

| | | | | |
|---|---|---|---|---|
| 5,289,037 A | * | 2/1994 | Savignac et al. | 257/776 |
| 5,994,766 A | * | 11/1999 | Shenoy et al. | 257/659 |
| 6,153,937 A | * | 11/2000 | Irie et al. | 257/775 |
| 6,160,298 A | * | 12/2000 | Ohkubo | 257/393 |
| 6,577,007 B1 | * | 6/2003 | Mehta | 257/750 |
| 6,864,171 B1 | * | 3/2005 | Hoinkis et al. | 438/638 |
| 2002/0121651 A1 | * | 9/2002 | Juengling | 257/211 |
| 2003/0036258 A1 | * | 2/2003 | Abbott et al. | 438/618 |
| 2006/0097399 A1 | * | 5/2006 | Hatano et al. | 257/773 |
| 2006/0131760 A1 | * | 6/2006 | Standing et al. | 257/787 |
| 2007/0272957 A1 | * | 11/2007 | Johnson et al. | 257/289 |
| 2008/0136043 A1 | * | 6/2008 | Ohtake et al. | 257/774 |
| 2011/0248399 A1 | * | 10/2011 | Pendse | 257/737 |
| 2012/0091986 A1 | * | 4/2012 | Takemae et al. | 323/311 |
| 2012/0261831 A1 | * | 10/2012 | Sudo | 257/774 |
| 2013/0095650 A1 | * | 4/2013 | Shimomura | 438/618 |

* cited by examiner

*Primary Examiner* — Tucker Wright
(74) *Attorney, Agent, or Firm* — Muncy, Geissler, Olds & Lowe, P.C.

(57) ABSTRACT

A wafer-level chip scale package is disclosed, including a chip including a substrate and a GaN transistor disposed on the substrate. The GaN transistor includes a first electrode, a dielectric layer disposed on the chip, and a redistribution trace disposed on the first dielectric layer and electrically connected with the first electrode, wherein the redistribution trace has a linear side and a curved side on opposite sides along its longitudinal direction.

18 Claims, 11 Drawing Sheets

WAFER-LEVEL CHIP SCALE PACKAGE

CROSS REFERENCE TO RELATED APPLICATIONS

This application claims the benefit of U.S. Provisional Application No. 61/902,201 filed Nov. 9, 2013, the entirety of which is incorporated by reference herein.

BACKGROUND OF THE INVENTION

1. Field of the Invention

This disclosure generally relates to a wafer-level chip scale package, and more particularly, to a wafer-level chip scale package having uniform current distribution.

2. Description of the Related Art

Current density is important to the design of electrical and electronic systems. Circuit performance depends strongly upon the designed current level, and the current density then is determined by the dimensions of the conducting elements. For example, as integrated circuits are reduced in size, despite the lower current demanded by smaller devices, there is a trend toward higher current densities to achieve higher device numbers in ever-smaller chip areas.

High current densities have undesirable consequences. Most electrical conductors have a finite, positive resistance, making them dissipate power in the form of heat. The current density must be kept sufficiently low to prevent the conductor from melting or burning up, the insulating material failing, or the desired electrical properties changing.

BRIEF SUMMARY OF INVENTION

An aspect of the disclosure provides a wafer-level chip scale package comprising the following elements. A semiconductor chip comprises a transistor formed therein. A first dielectric layer is disposed on the semiconductor chip. A first redistribution trace is disposed on the first dielectric layer and is electrically connected with a first electrode of the transistor. A second dielectric layer is disposed on the first redistribution trace. A first via is disposed in the second dielectric layer and is coupled with the first redistribution trace. A first pad is disposed on the second dielectric layer and electrically connected with the first redistribution trace through the first via, wherein the first redistribution trace has a linear side and a curved side on opposite sides along its longitudinal direction.

Another aspect of the disclosure provides a wafer-level chip scale package comprising the following elements. A semiconductor chip comprises a plurality of gallium nitride power transistors formed therein, each of the gallium nitride power transistors having a source electrode, a drain electrode, and a gate electrode. A source interconnection is formed on an outer surface of the semiconductor chip, and the source interconnection is electrically connected to the source electrodes of the gallium nitride power transistors. A drain interconnection is formed on the outer surface of the semiconductor chip, and the second drain interconnection is electrically connected to the drain electrodes of the gallium nitride power transistors. A first dielectric layer is disposed on the outer surface of the semiconductor chip and covers the source interconnection and the drain interconnection. A first redistribution trace is disposed on the first dielectric layer and is electrically connected with the source interconnection. A second redistribution trace is disposed on the first dielectric layer and is electrically connected with the drain interconnection, wherein the first redistribution trace has a beginning portion at the first via and an end portion adjacent to the second via, and the second redistribution trace has a beginning portion at the second via and an end portion adjacent to the first via. The width $W_1$ of the beginning portion of the first redistribution trace is different from the width $W_2$ of the end portion of the first redistribution trace.

Another aspect of the disclosure provides a wafer-level chip scale package, comprising a chip comprising a substrate and a GaN transistor disposed on the substrate. The GaN transistor comprises a first electrode, a dielectric layer disposed on the chip, and a redistribution trace disposed on the first dielectric layer and electrically connected with the first electrode, wherein the redistribution trace has a linear side and a curved side on opposite sides along its longitudinal direction.

BRIEF DESCRIPTION OF DRAWINGS

The disclosure can be more fully understood by reading the subsequent detailed description and examples with references made to the accompanying drawings.

DETAILED DESCRIPTION OF INVENTION

It should be understood that specific embodiments are provided as examples to teach the broader inventive concept, and one of ordinary skill in the art can easily apply the teaching of the present disclosure to other methods or apparatuses. The following discussion is only used to illustrate the disclosure, not limit the disclosure.

The disclosure is directed a wafer-level chip scale package having redistribution traces. The shape, position and configuration of the redistribution traces are specifically designed to improve current density of the semiconductor device.

Figure 1:
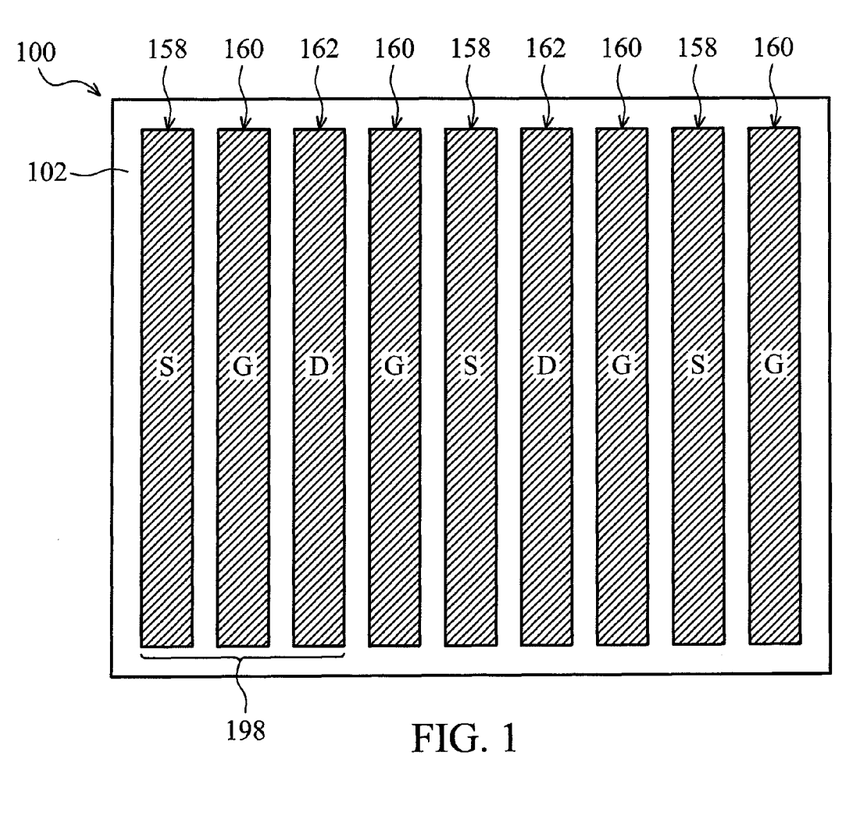
FIG. 1 shows a plan view of a semiconductor chip with source electrodes, drain electrodes and gate electrodes.

FIG. 1 shows a plan view of a semiconductor chip 100 on which transistors are formed. Referring to FIG. 1, a semiconductor chip 100 comprises a plurality of transistors 198 formed on a substrate 102, and each of the transistors 198 has a source electrode 158, a drain electrode 162, and a gate electrode 160. The transistors 198 may be formed on an active layer (not shown) on the substrate 102. In some embodiments, the substrate 102 and the active layer can be Si, SiC, Ge, SiGe, GaAs, InAs, InP or, GaN or AlGaN or other suitable material. The active layer can be formed by liquid phase epitaxy (LPE), vapor phase epitaxy (VPE), metal organic chemical vapor deposition (MOCVD), molecular beam epitaxy (MBE), epitaxial lateral overgrowth (ELOG) or other suitable method. In an embodiment of the disclosure, the transistors 198 are nitride-based power transistors, and the active layer comprises a plurality of nitride-based semiconductive layer with a two-dimensional electron gas (2DEG) channel therein and a high electron mobility transistor (HEMT) is formed in and above the active layer. In one embodiment, the active layer comprises a GaN layer and a AlGaN layer disposed on the GaN layer and has a 2DEG channel adjacent to the interface between the GaN layer and the AlGaN layer. In an embodiment of the disclosure, the semiconductor chip 100 is a power semiconductor device and the transistors 198 are connected in parallel.

Figure 2:
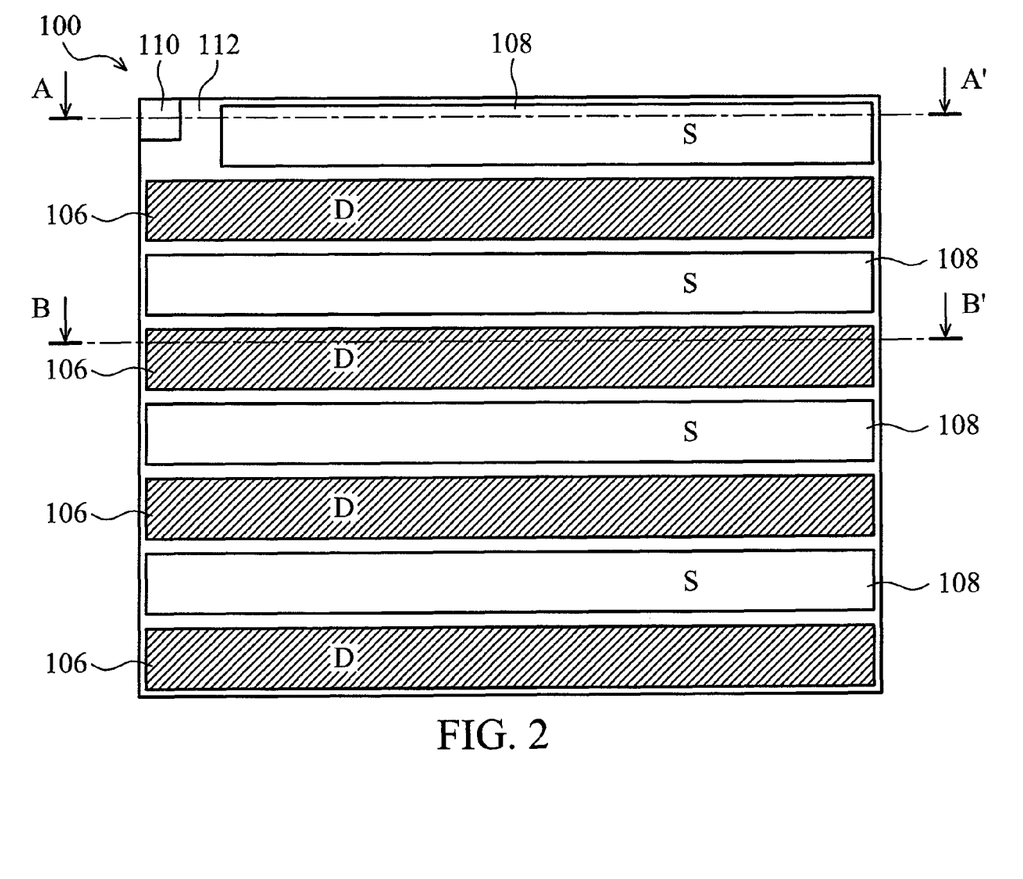
FIG. 2 shows a plan view of a semiconductor chip with interconnection layers.

FIG. 2 shows a plan view of a semiconductor chip 100 on which interconnection layers are formed. Referring to FIG. 2, source, drain, gate interconnection layers 108, 106 and 110 are formed on the transistors, which electrically connect the source electrodes 158, the drain electrodes 162, and the gate electrodes 160 respectively. The source electrodes 158, the drain electrodes 162, and the gate electrodes 160 of the plurality of transistors 198 are redistributed during the chip manufacturing process to simplify the electric interconnection and improve the electrical performance. Inter-metal dielectric layers (IMD), interlayer dielectric layers (IDL) and vias may be formed on the transistors but are not shown in the figures for simplicity.

Figure 3:
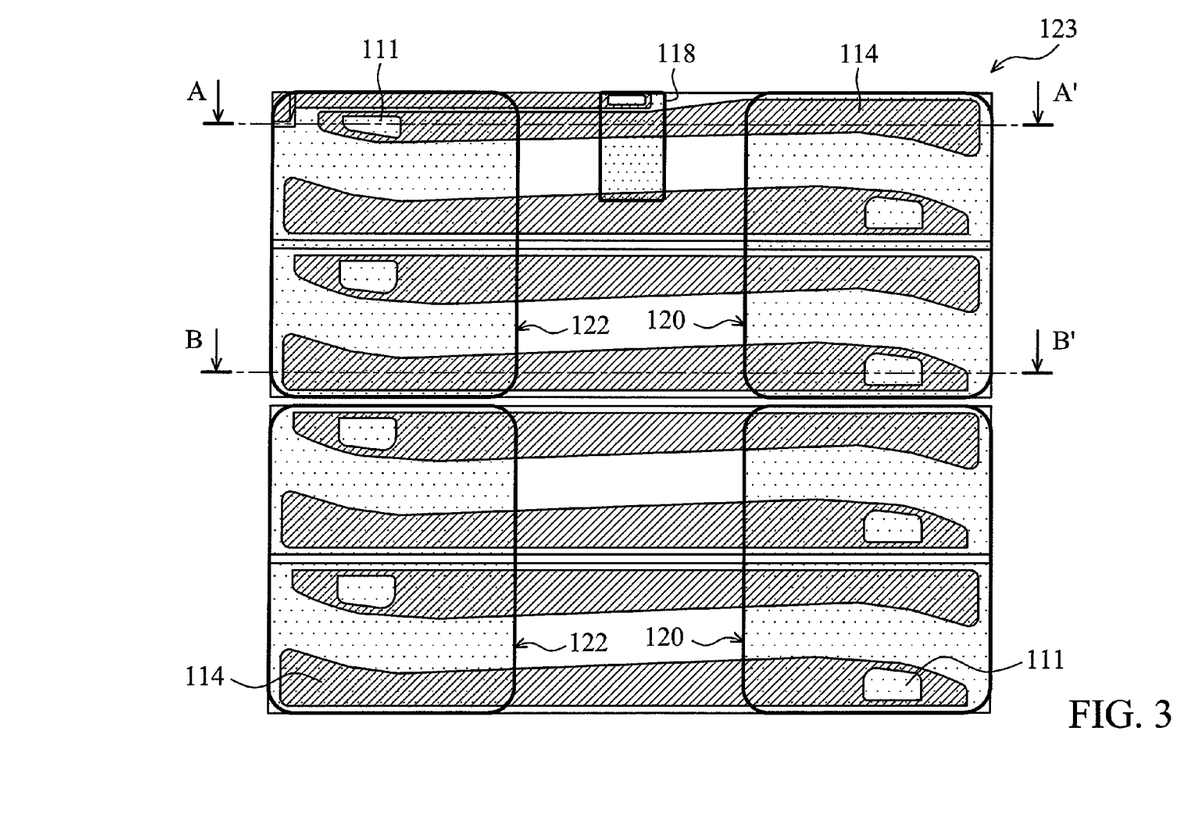
FIG. 3 shows a plan view of a wafer-level chip scale package with interconnection layers.

FIG. 3 is a plan view of a wafer-level chip scale package after trace layers and pads are formed. FIG. 4A-FIG. 4D show the stages of method for forming the wafer-level chip scale package along the cross section A-A' of FIGS. 2 and 3. FIG. 5A-FIG. 5D shows the stages of method for forming the wafer-level chip scale package along the cross section B-B' of FIGS. 2 and 3.

Figure 4A:
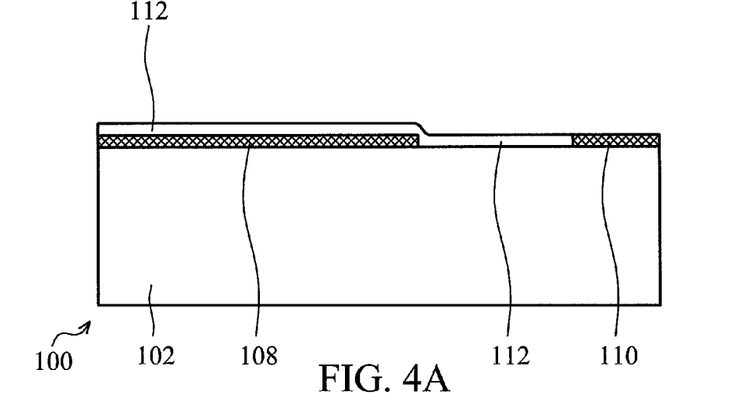
FIG. 4A-FIG. 4D show the stages of method for forming the wafer-level chip scale package along the cross section A-A' of FIGS. 2 and 3.
Figure 5A:
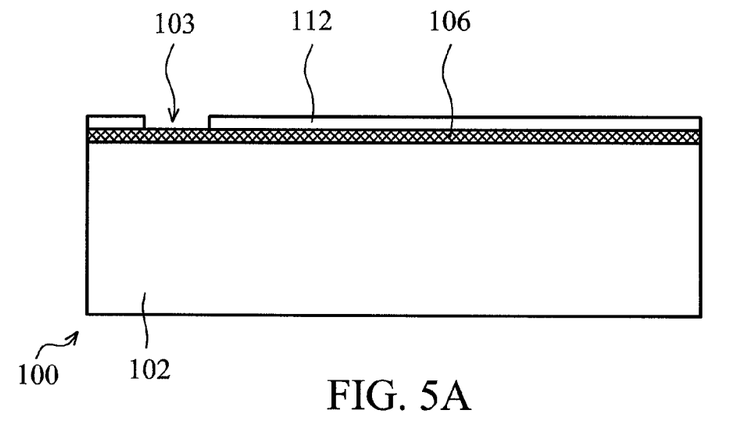
FIG. 5A-FIG. 5D shows the stages of method for forming the wafer-level chip scale package along the cross section B-B' of FIGS. 2 and 3.

Referring to FIG. 2, FIG. 4A and FIG. 5A, a semiconductor chip 100 with transistors formed on the substrate 102 is provided. As shown in FIG. 2, the source interconnections 108 and the drain interconnections 106 are alternately arranged. The gate interconnections 110 are adjacent to one end of one of the source interconnections 108 (or the drain interconnections).

A first dielectric layer 112 is formed on the substrate 102 and is filled into the space between the source interconnections 108 and the gate interconnections 110. In some embodiments, the first dielectric layer 112 may include silicon oxide, silicon nitride or silicon oxynitride. Alternatively, the first dielectric layer 112 may include polyimide, spin-on-glass (SOG), fluoride-doped silicate glass (FSG) or amorphous fluorinated carbon. In an example, the first dielectric layer 112 is polymide having a thickness ranging from about 0.1 μm to 10 μm.

The first dielectric layer 112 can be formed by chemical vapor deposition (CVD), plasma enhanced chemical vapor deposition (PECVD), atomic layer deposition (ALD), physical vapor deposition (PVD), spin-on coating and/or other processes. As shown in FIG. 5A, the first dielectric layer 112 is then patterned to form an opening 103 for forming conductive vias in subsequent steps. The portions of the first dielectric layer 112 over the gate interconnection 110 are also removed as shown in FIG. 4A. In some embodiments, the first dielectric layer 112 can be patterned by lithography and etching.

Figure 4B:
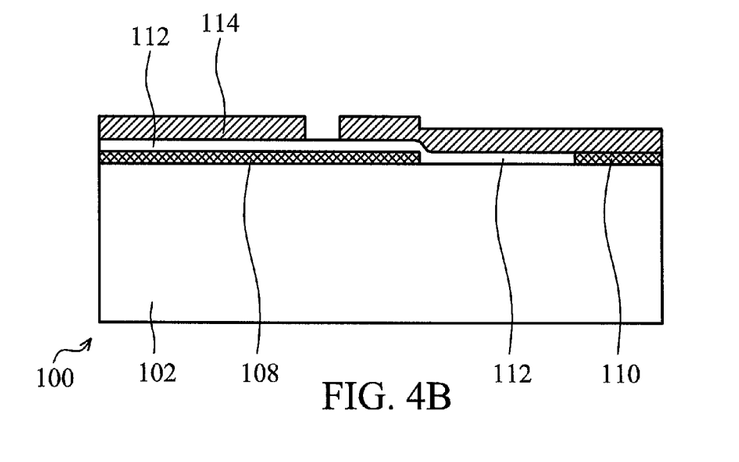
Figure 5B:
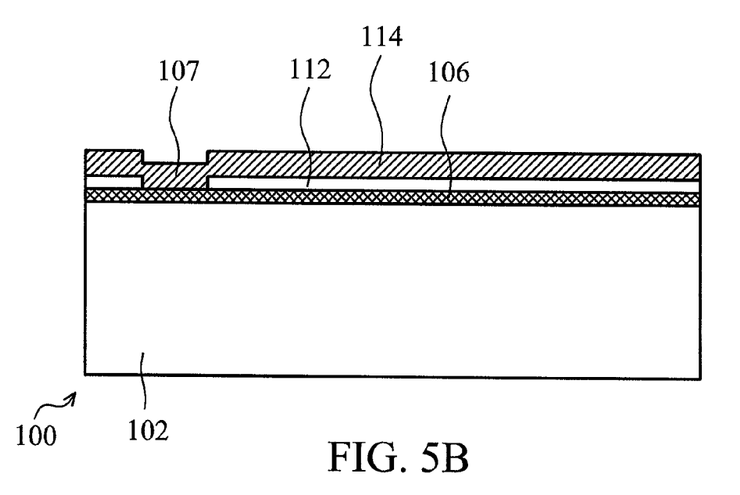

Referring to FIG. 4B, FIG. 5B and FIG. 3, a first trace layer 114 is formed on the first dielectric layer 112. The first trace layer 114 is filled into the opening 103 of the first dielectric layer 112 to form a first conductive plug 107. In some embodiments, the first trace layer 114 may include Ni, Au, Sn, Pb, Cu, Al, Ag, Cr, W, or alloy thereof. The first trace layer 114 rearranges the layout of the interconnection of the semiconductor chip. Therefore, the first trace layer 114 can also be referred to a redistribution layer in some embodiments. The first trace layer 114 can be formed by physical vapor deposition (PVD) or evaporation and patterned using lithography and etch process. The configuration of the first trace layer 114 will be described in detail with reference to FIG. 6.

Figure 4C:
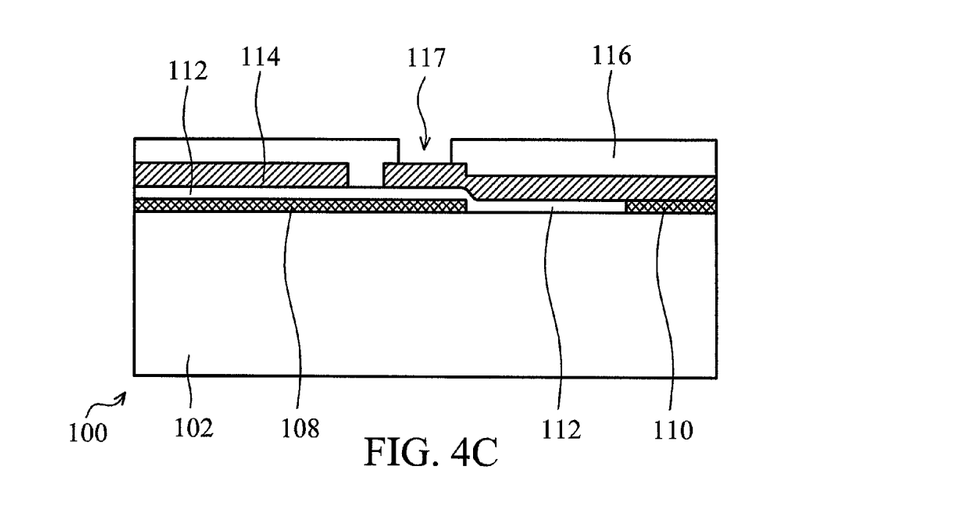
Figure 5C:
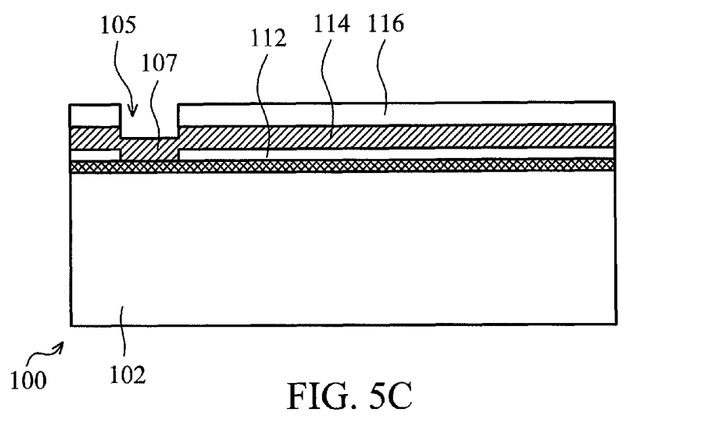

Referring to FIG. 4C and FIG. 5C, a second dielectric layer 116 is formed on the first trace layer 114. In some embodiments, the second dielectric layer 116 may include silicon oxide, silicon nitride or silicon oxynitride. Alternatively, the second dielectric layer 116 can comprise polyimide, spin-on-glass (SOG), fluoride-doped silicate glass (FSG) or amorphous fluorinated carbon. In an example, the second dielectric layer 116 is polymide having a thickness ranging from about 0.1 μm to 10 μm.

The second dielectric layer 116 can be formed by CVD, PECVD, ALD, PVD, spin-on coating and/or other suitable deposition processes. Referring to FIG. 5C, the second dielectric layer 116 is then patterned to form an opening 117 as shown in FIG. 4C and an opening 105 as shown in FIG. 5C for forming electrical connection to the first trace layer 114 in subsequent steps. In the embodiment, the opening 105 can be aligned to the opening 103 as shown in FIG. 5C. In some embodiments, the second dielectric layer 116 can be patterned by lithography and etching.

Figure 4D:
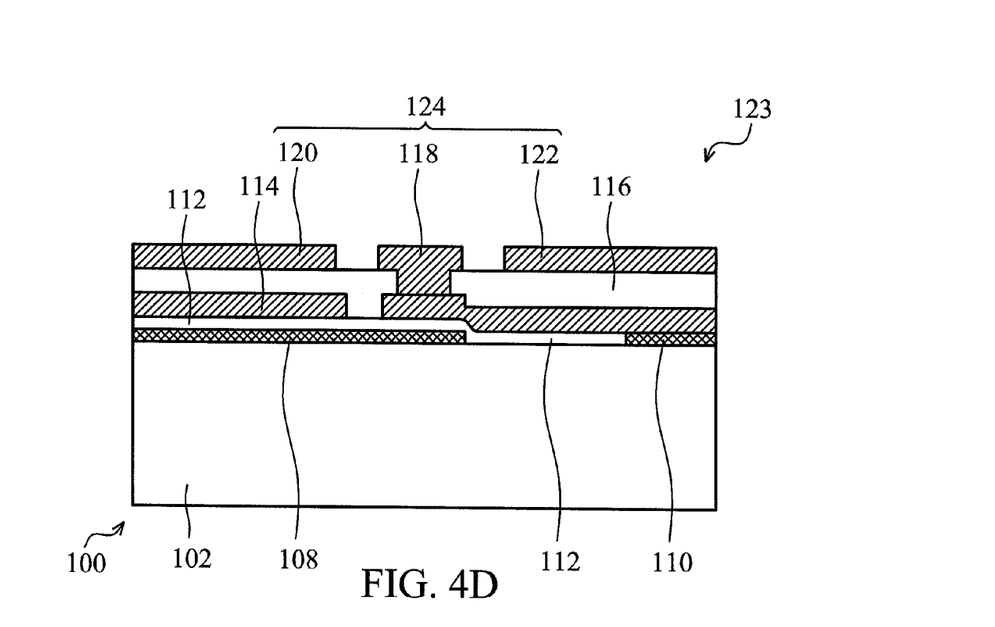
Figure 5D:
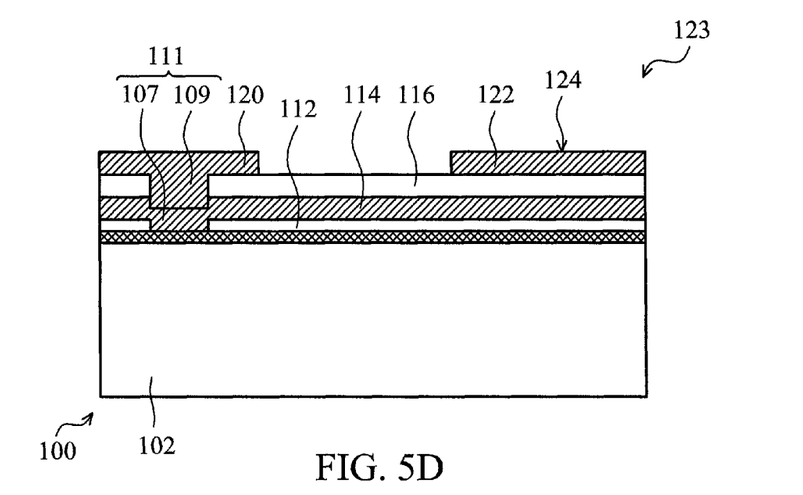

Referring to FIG. 4D and FIG. 5D and FIG. 3, a second trace layer 124 is formed on the second dielectric layer 116. The second trace layer 124 is filled into the opening 105 of the second dielectric layer 116 to form a second conductive plug 109 for electrically connecting the first trace layer 114. In some embodiments, the second trace layer 124 can comprise Ni, Au, Sn, Pb, Cu, Al, Ag, Cr, W, or alloy thereof.

The second trace layer 124 is patterned by lithography to form a source pad 122, a drain pad 120 and a gate pad 118. As shown in FIG. 3, the first trace layer 114 rearranges the layout of the electrical connection of the wafer-level ship scale package 123. The source interconnection 108, the drain interconnection 106 and the gate interconnection 110 can be electrically connected to outer circuits through the source pad 122, the drain pad 120 and the gate pad 118.

As shown in FIG. 4D, FIG. 5D and FIG. 3, a wafer-level chip scale package 123 comprising the following elements is thus formed. A semiconductor chip comprises a source interconnection 108, a gate interconnection 110 and a drain interconnection 106 formed on the outer surface of the semiconductor chip. A first dielectric layer 112 is on the semiconductor chip. A first trace layer 114, or called as a redistribution layer, is on the first dielectric layer 112. The first trace layer 114 is electrically connected to the semiconductor chip through a first conductive plug 107. A second dielectric layer 116 is on the first trace layer 114. A second trace layer 124 comprising a source pad 122, a drain pad 120 and a third pad 118 is on the second dielectric layer 116. The second trace layer 124 is electrically connected to the first trace layer 114 through a second conductive plug 109. Combination of the first conductive plug 107 and the second conductive plug 109 can be referred as a via 111. However, the invention is not limited thereto. In another embodiment, the plugs 107 and 108 might be arranged in different locations without overlapping.

Figure 6:
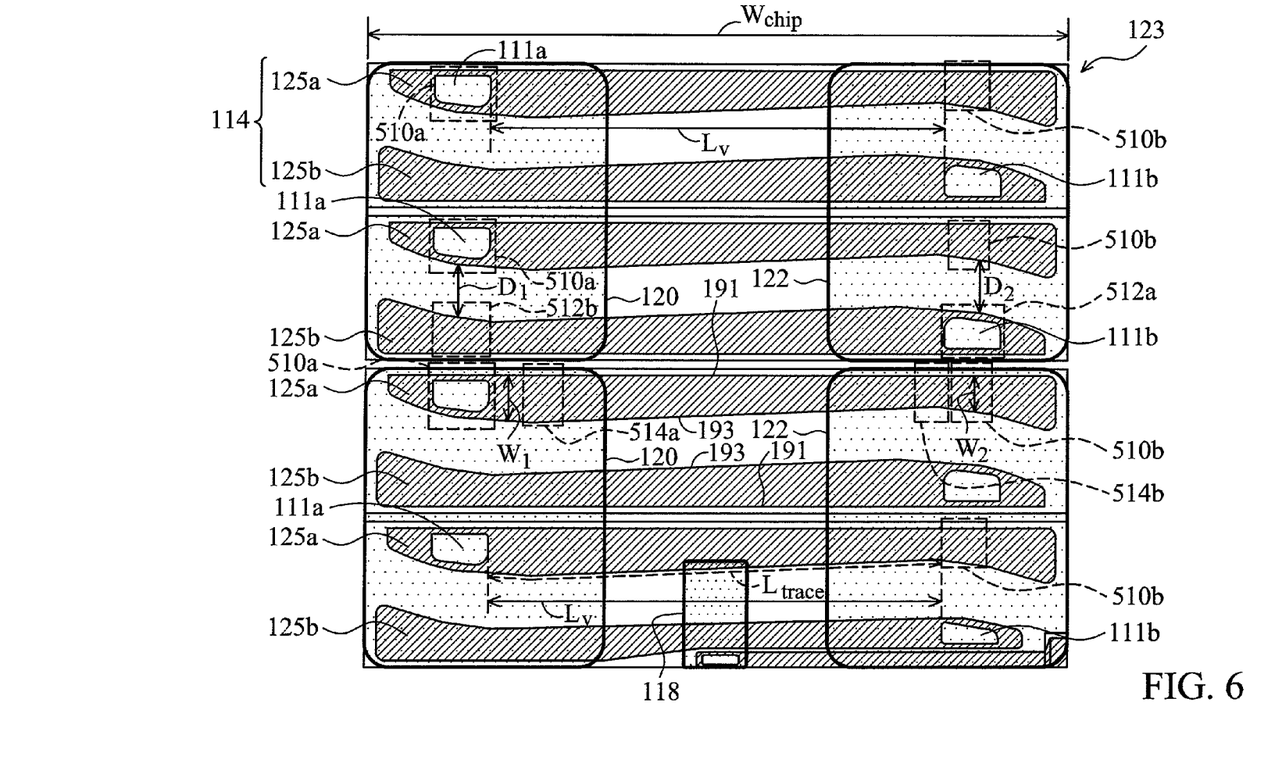
FIG. 6 shows a plan view of the wafer-level chip scale package of an embodiment of the disclosure.

Referring to FIG. 6, which shows a plan view of the wafer-level chip scale package 123 of some embodiments of the disclosure, the contour of the first trace layer and the position of the vias are specifically designed to achieve uniform current distribution.

In FIG. 6, the first trace layer 114 comprises a plurality of first redistribution traces 125a and second redistribution traces 125b. Two of the first redistribution traces 125a are connected to the first pad 122, and two of the second redistribution traces 125*b* are connected to the drain pad 120. The first redistribution trace 125*a* electrically connects the source interconnection 108 through a first via 111*a*. The second redistribution trace 125*b* electrically connects the drain interconnection 106 through a second via 111*b*.

The first redistribution trace 125*a* has a beginning portion 510*a* at the first via 111*a* and an end portion 510*b* adjacent to the second via 111*b*. The semiconductor chip 123 has a chip width $W_{chip}$. The first via 111*a* and second via 111*b* are spaced apart by a longitudinal distance $L_v$ along the longitudinal direction of the first redistribution trace 125*a*. In some embodiments, the distance $L_v$ between the first via 111*a* and the second via 111*b* is greater than half of width $W_{chip}$ of the chip (Condition 1, $L_v > \frac{1}{2} W_{chip}$). This critical range is set in order to optimize length of the traces 115.

In FIG. 6, the first redistribution trace 125*a* has a beginning portion 510*a* at the first via 111*a* and an end portion 510*b* adjacent to the second via 111*b*. The second redistribution trace 125*b* has a beginning portion 512*a* at the second via 111*b* and an end portion 512*b* adjacent to (or corresponding to the position of) the first via 111*a*. The distance $D_1$ between the beginning portion 510*a* of the first redistribution trace 125*a* and the end portion 512*b* of the second redistribution trace 125*b* divided by the distance $D_2$ between the end portion 510*b* of the first redistribution trace 125*a* and the beginning portion 512*a* of the second redistribution trace 125*b* is equal or greater than 0.5, and equal or less than 1.5 (Condition 2, $0.5 \le D_1/D_2 \le 1.5$). This critical range is set in order to keep current from directly flowing from one trace 125*a* to neighboring another trace 125*b*. For example, if $D_1/D_2$ is less than 0.5, current should directly flow from the first redistribution trace 125*a* to the second redistribution trace 125*b* without passing the center region of the first redistribution trace 125*a* between the first pad 122 and the second pad 120, and the active layer thereunder. It is noted that the design of the trace 115 wafer-level chip scale package 123 can meet either one of Condition 1 and Condition 2 or both of Condition 1 and Condition 2.

In addition, at least one of the conductive trace 115 is not rectangular shaped. In some embodiments, the first redistribution trace 125*a* has a beginning portion 510*a* and an end portion 510*b*, and width $W_1$ of the beginning portion 510*a* is different from the width $W_2$ of the end portion 510*b* (Condition 3).

More specifically, each of the first redistribution trace 125*a* and the second redistribution trace 125*b* has a linear side 191 and a curved side 193 on opposite sides along its longitudinal direction. Moreover, the curved sides 193 of the first redistribution trace 125*a* and the second redistribution trace 125*b* toward each other.

The first redistribution trace 125*a* may also have a first neck portion 514*a* and a second neck portion 514*b*. Width of the first redistribution trace 125*a* is gradually increased from the beginning portion 510*a* to the first neck portion 514*a*, is gradually reduced from the first neck portion 514*a* to the second neck portion 514*b* and is gradually increased from the second neck portion 514*b* to the end portion 510*b*. That is, the first redistribution trace 125*a* has the greatest width at the first neck portion 514*a*, and the smallest width at the second neck portion 514*b*.

Although the Condition 3 is applied to the first redistribution trace 125*a* in the paragraph above, the invention is not limited thereto. The Condition 3 can also be applied to the second redistribution trace 125*b*.

In some embodiments, the neck portion 514 is about ⅔ the length of the trace from the beginning portion 510*a* for, and is about ⅓ the length of the trace from the end portion 510*b*. In some embodiments, the neck portion 514 is ¾ the length of the trace from the beginning portion 510*a*, and is ¼ the length of the trace from the end portion 510*b*. In some embodiments, the neck portion 514 is about ⅘ the length of the trace from the beginning portion 510*a*, and is about ⅕ the length of the trace from the end portion 510*b*.

The position of the neck portion 514 is not limited. Position of the neck portion 514 can be changed according to product specification. The traces 125 are designed to have a specific shape of condition 3 in order to recollect current at the end portion of the trace to the vias.

The design of the trace 115 of the wafer-level chip scale package 123 can meet only one of Condition 1, Condition 2 or Condition 3 in some embodiments. In alternative embodiments, the design of the trace 115 of the wafer-level chip scale package 123 can meet Condition 1 and Condition 3. In alternative embodiments, the design of the trace 115 of the wafer-level chip scale package 123 can meet Condition 2 and Condition 3. In alternative embodiments, the design of the trace 115 can meet Condition 1, Condition 2 and Condition 3.

In FIG. 6, the first via 111*a* and end portion 510*b* are spaced apart by a distance $L_V$, the first redistribution trace 125*a* has a curvature length $L_{trace}$ from the first via 111*a* to the end portion 510*b*, and the curvature length $L_{trace}$ is greater than the distance $L_V$, (Condition 4, $L_{trace} > L_v$).

The design of the trace 115 of the wafer-level chip scale package 123 can meet Condition 1 and Condition 4 in some embodiment. In alternative embodiments, the design of the traces 115 can meet Condition 2 and Condition 4. In alternative embodiments, the design of the trace 115 can meet Condition 3 and Condition 4. In alternative embodiments, the trace 115 can meet Conditions 2, 3 and 4. In alternative embodiments, the trace 115 can meet Conditions 1, 2 and 4. In alternative embodiments, the trace 115 can meet Condition 1, 3 and 4. In alternative embodiments, the trace 115 can meet Conditions 1, 2, 3 and 4.

Figure 7:
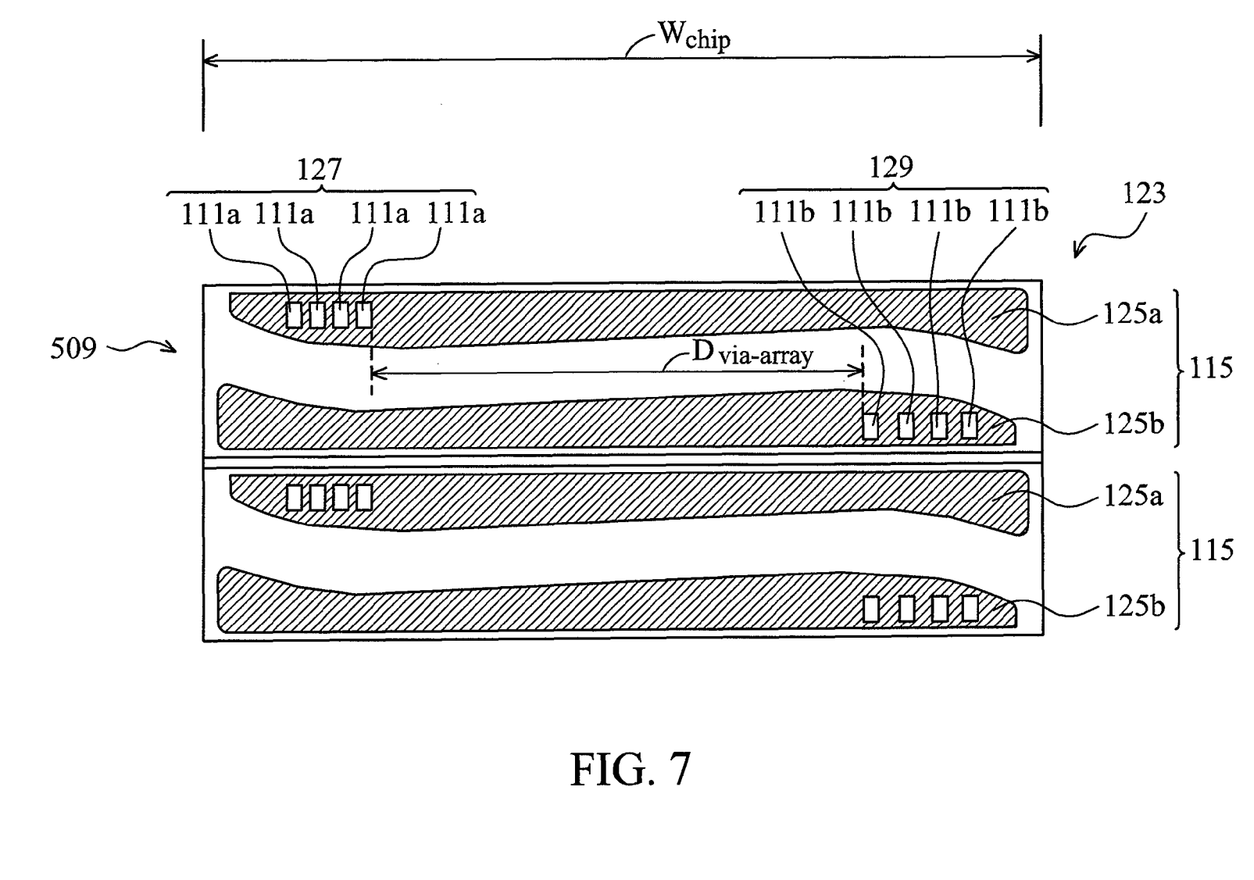
FIG. 7 shows a plan view of the wafer-level chip scale package of another embodiment of the disclosure.

FIG. 7 shows a plan view of the wafer-level chip scale package 123 of another embodiment of the disclosure. This embodiment is similar to the embodiment of the FIG. 6 except that the first and second via are replaced by a via array.

Referring to FIG. 7, the wafer-level chip scale package 123 has a chip width $W_{chip}$. The first redistribution trace 125*a* comprises a plurality of first vias 111*a* to form a first via array 127, the second redistribution trace 125*b* comprises a plurality of second vias 111*b* to form a second via array 129, the first via array 127 and second via array 129 are spaced apart by a closest longitudinal distance $D_{via-array}$ along the longitudinal direction of the first redistribution trace, and $D_{via-array} < \frac{1}{2} W_{chip}$. (condition 5). This critical range is to make current to be more uniform on the traces. The number of the vias of the via array is not specifically limited and can be more or less than that shown in FIG. 7.

The design of the trace 115 can meet Condition 1 and Condition 5 in some embodiments. In alternative embodiments, the design of the trace 115 can meet Condition 2 and Condition 5. In alternative embodiments, the design of the trace 115 can meet Condition 3 and Condition 5. In alternative embodiments, the design of the trace 115 can meet Condition 4 and Condition 5. In alternative embodiments, the design of the trace 115 can meet Conditions 1, 2 and 5. In alternative embodiments, the design of the trace 115 can meet Conditions 1, 3 and 5. In alternative embodiments, the design of the trace 115 can meet Conditions 1, 4 and 5. In alternative embodiments, the design of the trace 115 can meet Conditions 2, 3 and 5. In alternative embodiments, the design of the trace 115 can meet Conditions 2, 4 and 5. In alternative embodiments, the design of the trace 115 can meet Conditions 3, 4 and 5.

In alternative embodiments, the design of the trace 115 can have Conditions 2, 3, 4 and 5. In alternative embodiments, the design of the trace 115 can have conditions 1, 2, 3, 4 and 5. In alternative embodiments, the design of the trace 115 can have conditions 1, 3, 4 and 5. In alternative embodiments, the design of the trace 115 can have conditions 1, 2, 4 and 5. In alternative embodiments, the design of the trace 115 can have conditions 1, 2, 3 and 5.

The shape, position and specification of the redistribution traces are specifically designed to have uniform current density. Therefore, issues due to non-uniform current density of the semiconductor devices of some embodiments of the disclosure can be reduced.

The disclosure is not limited to the wafer-level chip scale package 123 described above. In some embodiments, the disclosure can also comprise a printed circuit board (PCB) having a wafer-level chip scale package described above.

Figure 8A:
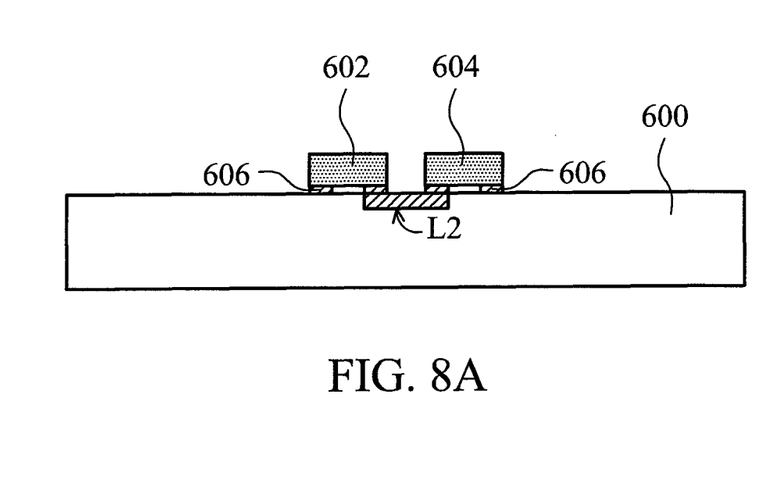
FIG. 8A shows a PCB of an embodiment of the disclosure.
Figure 8B:
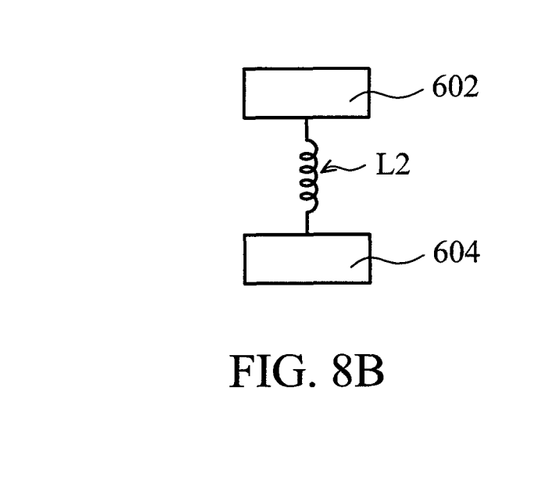
FIG. 8B shows a circuit diagram of FIG. 8A.

Referring to FIG. 8A, the PCB of some embodiments of the disclosure uses the wafer-level chip scale packages 602, 604 having the first and second redistribution traces as described in FIG. 6 and FIG. 7. The wafer-level chip scale packages 602, 604 are bonded to the PCB substrate 600 through pads 606. The wafer-level chip scale packages 602, 604 can be the wafer-level chip scale package shown in FIG. 6 and FIG. 7 to electrically connect the electrodes to the pads through the first and second redistribution traces. Parasitic inductance within the wafer-level chip scale packages 602, 604 can be neglected. Only the parasitic inductance L2 between wafer-level chip scale packages 602, 604 is considerable, as shown in FIG. 8B.

Figure 9A:
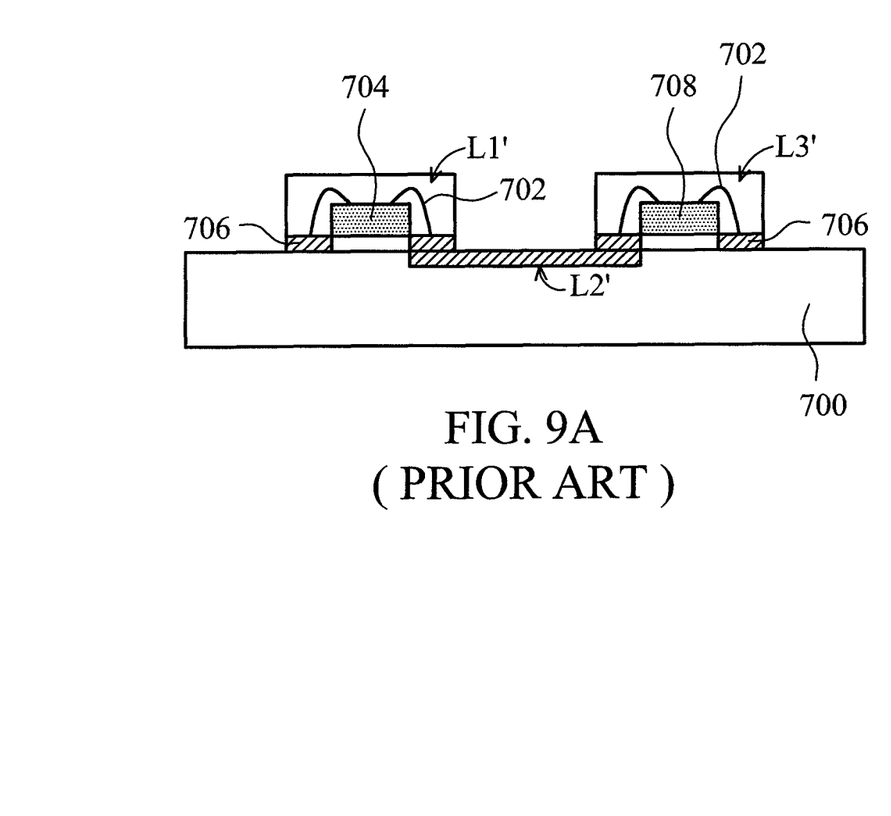
FIG. 9A shows the PCB of the conventional art.
Figure 9B:
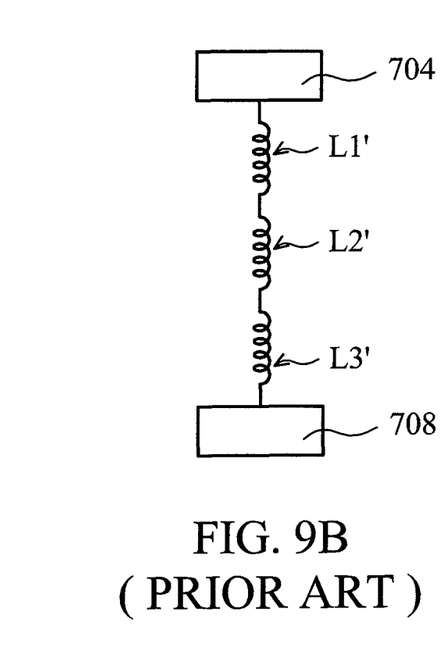
FIG. 9B shows the circuit diagram of FIG. 9A.

On the contrary, referring to FIG. 9A, a conventional PCB using bonding wires 702 to electrically connect pads 706 and semiconductor devices 704, 708 is shown. All of the parasitic inductances L1' and L3' between the first and second semiconductor devices 704, 708 and the pads 706 cannot be neglected. As shown in FIG. 9B, the PCB including the first semiconductor device 704 and the second semiconductor device 708 has the parasitic inductance L1' between the first semiconductor device 708 and the pad 706, the parasitic inductance L3' between the second semiconductor device 708 and the pad 706, and the parasitic inductance L2' between the first and second semiconductor devices 704, 708.

The PCB in accordance with the disclosure as shown in FIG. 8A has less overall parasitic inductance than the conventional art shown in FIG. 9A.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer-level chip scale package, comprising:
a semiconductor chip comprising a transistor formed therein;
a first dielectric layer disposed on the semiconductor chip;
a first redistribution trace disposed on the first dielectric layer and electrically connected with a first electrode of the transistor;
a second dielectric layer disposed on the first redistribution trace;
a first via disposed in the second dielectric layer and coupled with the first redistribution trace; and
a first pad disposed on the second dielectric layer and electrically connected with the first redistribution trace through the first via;
wherein the first redistribution trace has a linear side and a curved side on opposite sides along its longitudinal direction,
wherein the first redistribution trace has a beginning portion at the first via and an end portion adjacent to a second via, the first via and the end portion of the first redistribution trace are spaced apart by a distance $L_v$, the first redistribution trace has a curvature length $L_{trace}$ from the first via to the end portion of the first redistribution trace, and the curvature length $L_{trace}$ is greater than the distance $L_v$.

2. The wafer-level chip scale package as claimed in claim 1, further comprising:
a second redistribution trace disposed on the first dielectric layer and electrically connected with a second electrode of the transistor;
the second via disposed in the second dielectric layer and coupled with the second redistribution trace; and
a second pad disposed on the second dielectric layer and electrically connected with the second redistribution trace through the second via;
wherein the second redistribution trace has a linear side and a curved side on opposite sides along its longitudinal direction.

3. The wafer-level chip scale package as claimed in claim 2, wherein the curved sides of the first redistribution trace and second redistribution traces toward each other.

4. The wafer-level chip scale package as claimed in claim 2, wherein the second redistribution trace has a beginning portion at the second via and an end portion adjacent to the first via, a distance $D_1$ between the beginning portion of the first redistribution trace and the end portion of the second redistribution trace divided by a distance $D_2$ between the end portion of the first redistribution trace and the beginning portion of the second redistribution trace is equal or greater than 0.5, and equal or less than 1.5.

5. The wafer-level chip scale package as claimed in claim 4, wherein the beginning portion and the end portion of the first redistribution trace have different widths.

6. The wafer-level chip scale package as claimed in claim 2, wherein the semiconductor chip has a chip width $W_{chip}$, and the first via and second via are spaced apart by a longitudinal distance $L_v$, along the longitudinal direction of the first redistribution trace, wherein $L_v > \frac{1}{2} W_{chip}$.

7. A printed circuit board, comprising:
a printed circuit board substrate; and
the wafer-level chip scale package as claimed in claim 2, bonded to the printed circuit board substrate through a pad.

8. The printed circuit board as claimed in claim 7, wherein the second redistribution trace has a beginning portion at the second via and an end portion adjacent to the first via, a distance $D_1$ between the beginning portion of the first redistribution trace and the end portion of the second redistribution trace divided by a distance $D_2$ between the end portion of the first redistribution trace and the beginning portion of the second redistribution trace is equal or greater than 0.5, and equal or less than 1.5.

9. The printed circuit board as claimed in claim 8, wherein the width $W_1$ of the beginning portion of the first redistribution trace is different from the width $W_2$ of the end portion of the first redistribution trace.

10. The printed circuit board as claimed in claim 7, wherein the semiconductor chip has a chip width $W_{chip}$, and the first via and second via are spaced apart by a longitudinal distance $L_v$ along the longitudinal direction of the first redistribution trace, wherein $L_v > \frac{1}{2} W_{chip}$.

11. The printed circuit board as claimed in claim 7, wherein the semiconductor chip has a chip width $W_{chip}$, the first redistribution trace comprises a plurality of the first vias to form a first via array, the second redistribution trace comprises a plurality of the second vias to form a second via array, the first and second via arrays are spaced apart by a closest longitudinal distance $D_{via\text{-}array}$ along the longitudinal direction of the first redistribution trace, wherein $D_{via\text{-}array} < \frac{1}{2} W_{chip}$.

12. The wafer-level chip scale package as claimed in claim 1, wherein the semiconductor chip has a chip width $W_{chip}$, the first redistribution trace comprises a plurality of the first vias to faun a first via array, the second redistribution trace comprises a plurality of the second vias to form a second via array, the first and second via arrays are spaced apart by a closest longitudinal distance $D_{via\text{-}array}$ along the longitudinal direction of the first redistribution trace, wherein $D_{via\text{-}array} < \frac{1}{2} W_{chip}$.

13. The wafer-level chip scale package as claimed in claim 1, wherein the semiconductor chip comprises an active layer and the transistor is formed in or on the active layer, and wherein the active layer comprises Si, SiC, Ge, SiGe, GaAs, InAs, InP, GaN or AlGaN.

14. A wafer-level chip scale package, comprising:
a semiconductor chip comprising:
    a plurality of gallium nitride power transistors formed therein, each of the gallium nitride power transistors having a source electrode, a drain electrode, and a gate electrode;
    a source interconnection formed on an outer surface of the semiconductor chip, the source interconnection being electrically connected to the source electrodes of the gallium nitride power transistors; and
    a drain interconnection formed on the outer surface of the semiconductor chip, the second drain interconnection being electrically connected to the drain electrodes of the gallium nitride power transistors;
a first dielectric layer disposed on the outer surface of the semiconductor chip and covering the source interconnection and the drain interconnection;
a first redistribution trace disposed on the first dielectric layer and electrically connected with the source interconnection through a first via; and
a second redistribution trace disposed on the first dielectric layer and electrically connected with the drain interconnection through a second via;
wherein the width $W_1$ of a beginning portion of the first redistribution trace is different from the width $W_2$ of an end portion of the first redistribution trace,
wherein the first redistribution trace has a beginning portion at the first via and an end portion adjacent to the second via, the first via and the end portion of the first redistribution trace are spaced apart by a distance $L_v$, the first redistribution trace has a curvature length $L_{trace}$ from the first via to the end portion of the first redistribution trace, and the curvature length $L_{trace}$ is greater than the distance $L_v$.

15. The wafer-level chip scale package as claimed in claim 14, wherein the second redistribution trace has a beginning portion at the second via and an end portion adjacent to the first via, a distance $D_1$ between the beginning portion of the first redistribution trace and the end portion of the second redistribution trace divided by a distance $D_2$ between the end portion of the first redistribution trace and the beginning portion of the second redistribution trace is equal or greater than 0.5, and equal or less than 1.5.

16. The wafer-level chip scale package as claimed in claim 14, wherein the semiconductor device has a chip width $W_{chip}$, and the first via and second via are spaced apart by a longitudinal distance $L_v$ along the longitudinal direction of the first redistribution trace, wherein $L_v > \frac{1}{2} W_{chip}$.

17. The wafer-level chip scale package as claimed in claim 14, wherein the semiconductor device has a chip width $W_{chip}$, the first redistribution trace comprises a plurality of the first vias to form a first via array, the second redistribution trace comprises a plurality of the second vias to form a second via array, the first and second via arrays are spaced apart by a closest longitudinal distance $D_{via\text{-}array}$ along the longitudinal direction of the first redistribution trace, wherein $D_{via\text{-}array} < \frac{1}{2} W_{chip}$. 21.

18. A wafer-level chip scale package, comprising:
a chip comprising a substrate and a nitride-based transistor disposed on the substrate, the nitride-based transistor comprising a first electrode and a second electrode;
a dielectric layer disposed on the chip;
a first redistribution trace disposed on the first dielectric layer and electrically connected with the first electrode through a first via; and
a second redistribution trace disposed on the first dielectric layer and electrically connected with the second electrode through a second via,
wherein the redistribution trace has a linear side and a curved side on opposite sides along its longitudinal direction, wherein the first redistribution trace has a beginning portion at the first via and an end portion adjacent to the second via, the first via and the end portion of the first redistribution trace are spaced apart by a distance $L_v$, the first redistribution trace has a curvature length $L_{trace}$ from the first via to the end portion of the first redistribution trace and the curvature length $L_{trace}$ is greater than the distance $L_v$.

* * * * *